United States Patent [19]

Koubek et al.

[11] 4,047,052
[45] Sept. 6, 1977

[54] CIRCUIT ARRANGEMENT FOR REGULATING THE AMPLITUDE OF A SAWTOOTH GENERATOR

[75] Inventors: Michael Koubek, Munich; Dietmar Mallon, Zorneding, both of Germany

[73] Assignee: Siemens Aktiengesellschaft, Berlin & Munich, Germany

[21] Appl. No.: 667,516

[22] Filed: Mar. 16, 1976

[30] Foreign Application Priority Data

Mar. 17, 1975 Germany .............................. 2511642

[51] Int. Cl.² .......................................... H03K 4/08
[52] U.S. Cl. .................................... 307/228; 328/185
[58] Field of Search ......................... 307/228; 328/185

[56] References Cited

U.S. PATENT DOCUMENTS

| 2,715,182 | 8/1955 | Bishop | 328/185 |
| 3,217,271 | 11/1965 | Autorino et al. | 328/185 |
| 3,373,377 | 3/1968 | Townsend | 328/185 |
| 3,571,617 | 3/1971 | Hainz | 328/185 |
| 3,577,007 | 5/1971 | Cross | 307/228 |
| 3,808,460 | 4/1974 | Mosca | 307/228 |

Primary Examiner—Stanley D. Miller, Jr.
Attorney, Agent, or Firm—Hill, Gross, Simpson, Van Santen, Steadman, Chiara & Simpson

[57] ABSTRACT

An arrangement for regulating the amplitude of a sawtooth generator employs a capacitor which is periodically charged and discharged by a current source by way of a switch, the switch being controlled by a synchronizing signal. The regulating circuit is provided with a second capacitor across which the mean value of the sawtooth pulses present across the first capacitor is formed. The regulating circuit also contains a comparator which compares the mean value with a reference value, and in dependence upon this comparison, the charging current for the first capacitor is controlled in such a manner that the mean value is equal to the reference value.

1 Claim, 3 Drawing Figures

CIRCUIT ARRANGEMENT FOR REGULATING THE AMPLITUDE OF A SAWTOOTH GENERATOR

BACKGROUND OF THE INVENTION

1. Field of the Invention

This invention relates to a circuit arrangement for regulating the amplitude of a sawtooth wave generator, and more particularly to an arrangement in which a capacitor is periodically charged and discharged by a current source via a switch, the switch being controlled by a synchronizing signal.

2. Description of the Prior Art

A sawtooth generator of the type mentioned above produces a sawtooth signal in a very simple manner. The capacitor is linearly charged by the current source. At the end of a sawtooth period the capacitor is rapidly discharged, whereupon the charging process is reinitiated. This process is controlled by the switch, i.e. by the pulses of the synchronizing signal which controls the switch. If the frequency of the switch, and thus that of the periodic changes, the charging of the capacitor is terminated at different values of amplitude. The amplitude of the sawtooth voltage at the output of the sawtooth generator is thus dependent upon frequency. If, for example, the frequency of the switch increases, the capacitor has less time to become charged. The charge is terminated at a lower value and thus the amplitude of the sawtooth voltage becomes lower. This fact is represented in FIG. 1 of the drawing in which the interval $a$ between two pulses of a synchronizing signal S produces a greater amplitude of the sawtooth voltage V than the synchronizing pulses with the shorter interval $b$ therebetween, and thus with a higher frequency.

In many applications this can result in undesirable consequences. For example, in the case of the production of the sawtooth signal for the operation of the vertical deflecting stage in television receivers, this means that a modified picture frequency produces a change in the picture height. If the vertical oscillator is in the form of a sawtooth generator whose sawtooth signal rises with a constant gradient between two fixed trigger limits, then in an unsynchronized state the sawtooth signal possesses a no-load frequency which, in practical situations, lies below the synchronizing frequency. European manufacturers fix the no-load frequency at approximately 44 Hz, the synchronizing frequency amounting to 50 Hz in Europe, and 60 Hz in the United States and in Japan. If the vertical oscillator is synchronized by the vertical synchronizing pulses, the last component of the sawtooth signal is cut off before the upper trigger threshold is reached, as is represented in FIG. 1 in respect of the interval $b$ between the synchronizing pulses. As a consequence, not only is the amplitude of the sawtooth signal reduced, but in addition the dc voltage mean value is displaced. The reduction in the sawtooth signal amplitude in the case of synchronized operation in comparison to unsynchronized operation, such as can occur on the transfer of channels or, e.g. in the case of the breakdown of a transmitter even for a long period of time, indicates that the vertical output stage must be designed in accordance with the current which in this unfavorable situation is of a greater magnitude. The shift in the mean value produces an unstationary state which becomes manifest in a build-up of the picture state. The picture thereby exhibits a disturbing luffing in the vertical direction.

Multi-standard equipment demand different vertical frequencies, using a vertical oscillator which oscillates at the lowest occurring frequency and which is synchronized with the aid of the received vertical synchronizing pulses to a higher frequency, depending upon the standard. This would mean that whenever, for example, vertical frequencies are to be processed, which can differ by up to 20%, the picture height would likewise differ by 20%.

SUMMARY OF THE INVENTION

The primary object of the present invention is to provide a simple circuit arrangement with the aid of which the amplitude of the sawtooth generator can be maintained constant independently of the frequency of the synchronizing pulses which control the sawtooth generator.

In order to realize the above object, and in a circuit arrangement of the type initially described above, it is proposed, according to the present invention, that a regulating circuit be provided which contains a second capacitor across which a mean value of the sawtooth pulses present across the first capacitor is formed, that the regulating circuit also contains a comparator which compares this means value with a reference value, and that in dependence upon this composition the charging current for the first capacitor is controlled in such a manner that the mean value is equal to the reference value.

A circuit arrangement of this type constructed in accordance with the invention regulates the amplitude of the sawtooth pulses in a simple fashion by virtue of the regulation of the mean value. Simultaneously, the two above-mentioned disadvantages which arise from a variation of the sawtooth amplitude and of the mean value are avoided.

In an advantageous embodiment of a circuit arrangement constructed in accordance with the invention, it is provided that the comparator consists of a differential amplifier having a constant current source, whose difference output current determines the charging current of the first capacitor by way of a so-called current reflector.

BRIEF DESCRIPTION OF THE DRAWING

Other objects, features and advantages of the invention, its organization, construction and operation will be best understood from the following detailed description taken in conjunction with the accompanying drawing, on which.

DESCRIPTION OF THE PREFERRED EMBODIMENT

Figure 1:
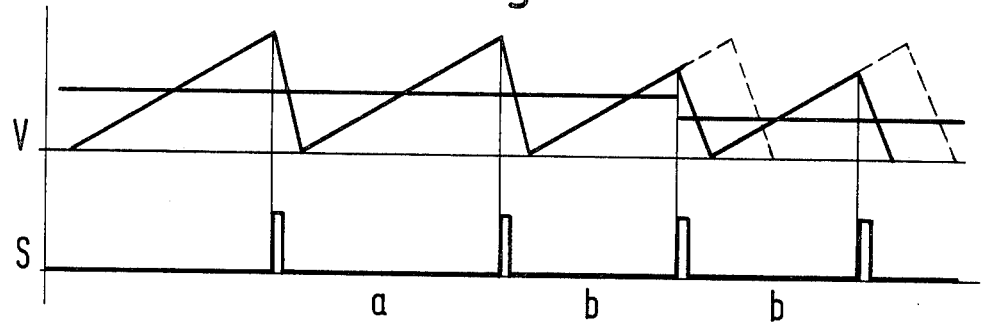
FIG. 1 is a graphic illustration showing the reduction in the sawtooth signal amplitude as a result of an increase in the frequency of the synchronizing signal S.
Figure 2:
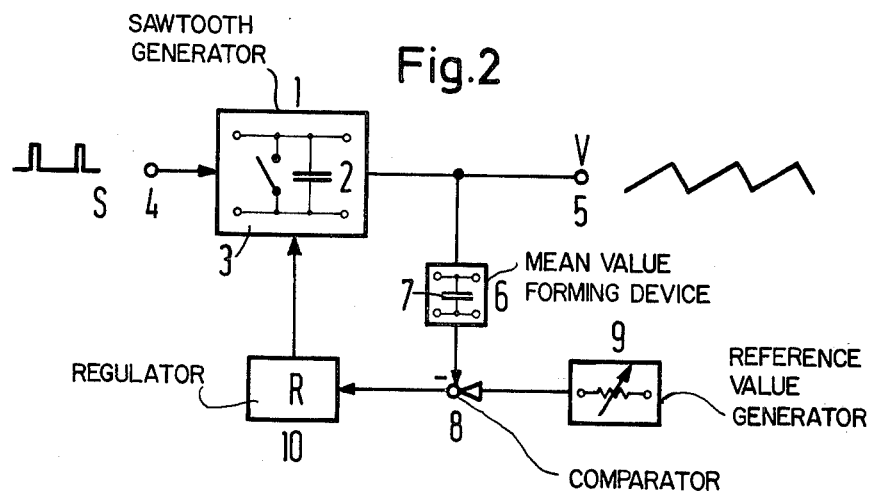
FIG. 2 is a schematic block diagram of a circuit arrangement constructed in accordance with the invention.

Referring to FIGS. 1 and 2, a sawtooth generator 1 is schematically illustrated in FIG. 2 as comprising a capacitor 2 and a switch 3. The capacitor 2 is periodically charged and discharged by way of the operation of the switch 3. The switch 3 is controlled by synchronizing pulses S received at an input 4. The sawtooth generator 1 is connected to an output 5 for providing a sawtooth signal V. The output of the sawtooth generator 1 is also connected to a mean value forming device 6 which contains a capacitor 7. The output of the mean value forming device 6 is connected to a comparator 8 in which the mean value of the sawtooth signal V, formed by the mean value forming device 6, is compared with a reference value supplied by a reference value generator 9. To complete the circuit, the comparator 8 is connected by way of a regulator 10 to a control input of the sawtooth generator 1. The difference signal supplied by the comparator 8 ensures, by way of the regulator 10, that the charging current of the capacitor 2 is influenced in such a manner that the difference between the mean value and the reference value is compensated. If, for example, the mean value of the sawtooth signal V is lower than the reference value, the charging current of the capacitor 2 is increased. That is to say that the sawtooth signal V reaches its reference amplitude at the latest when a synchronizing pulse instigates the discharge process.

The exemplary embodiment of the invention illustrated in FIG. 3 again contains the capacitor 2 and the capacitor 7. Here, the mean value forming device 6 comprises not only the capacitor 7, but also a resistor 11. The capacitor 2 is connected between the output 5 for the sawtooth signal V and a reference potential, here ground. In parallel to the latter is connected a series connection of the resistor 11 and the capacitor 7.

The comparator 8 comprises a differential amplifier which is formed from two transistors 12 and 13. The emitter of these transistors are interconnected and are connected by way of a constant current source 31 to the reference potential. The base of the transistor 12 is connected to the point of connection of the capacitor 7 and the resistor 11, and the collector carries a supply potential. The base of the transistor 13 is connected to a divider point of an ohmic voltage divider which comprises a pair of resistors 14 and 15, which are connected between the supply potential and the reference potential, the voltage divider representing the reference value generator 9 of FIG. 2.

The collector of the transistor 13 is connected to the bases of a pair of transistors 16 and 17 whose emitters carry the supply potential. Also, the collector of the transistor 17 is connected to bases and across a constant current source 18 to the reference potential. The collector of the transistor 16 is connected to that side of the capacitor 2 which is connected to the output 5. The two transistors 16 and 17 form a so-called current reflector. That is to say that the current flowing through the transistor 17 must flow in equal magnitude across the transistor 16 and into the capacitor 2. Thus, the transistor 16 forms the current source which charges the capacitor 2 and whose current is dependent upon the comparison of the two voltages present across the bases of the two transistors 12 and 13. If the voltage formed across the base of the transistor 12 by the capacitor 7 as the mean value of the sawtooth voltage present across the capacitor 2 is lower than the voltage connected by the voltage divider 14, 15 as the reference value to the base of the transistor 13, the transistor 13 takes a larger proportion of the current supplied by the constant current source 31 than the transistor 12. Consequently, there is an increase in the charging current flowing from the current reflector 16, 17 into the capacitor 2, so that the deviation of the mean value from the reference value is compensated. The constant current source 18 forms a start circuit which ensures that when the circuit arrangement is switched on, the capacitor 2 is always charged. In this exemplary embodiment of the invention, the transistors 12 and 13 of the differential amplifier are of the npn type, whereas the transistors 16 and 17 of the current reflector are of the pnp type.

The switch which serves to control the charging and discharging process of the capacitor 2 is constructed as follows. The collector of a transistor 19 is connected to the capacitor 2 and to the base of the transistor 20. The emitter of the transistor 19 is connected to the ground reference potential. The base is connected to the base of a transistor 21 and to the collector of a transistor 22. The emitters of the two transistors 20 and 22 are interconnected and are connected to the supply potential by way of a constant current source 23. The collectors of the two transistors 20 and 22 are connected, by way of a current reflector, to the reference potential. To this end, the collector of the transistor 20 is connected to the base of two transistors 24 and 25 and to the collector of the transistor 25. The collector of the transistor 24 is connected to the bases of the transistors 19 and 21 and to the collector of the transistor 22. The emitters of the two transistors 24 and 25 and also the emitter of the transistor 21 carry the ground reference potential. The base of the transistor 22 is connected at a third, uppermost divider point of a voltage divider comprising four resistors 26-29 connected between the ground reference potential and the supply potential. The collector of the transistor 21 is connected to the second, middle divider point. The lower divider point is connected to the collector of a transistor 30 whose emitter is connected to the ground reference potential and whose base is connected to the input 4 for receiving the synchronizing signal S.

When the transistor 20 is conductive, the capacitor 2 is charged by way of the transistors 13, 16 and 17, and its voltage increases. When the upper trigger threshold, determined by the potential of the third divider point, is reached, the transistor 22 becomes conductive and the transistor 20 is blocked. As a result of the blockage of the transistor 20, the transistors 24 and 25 of the current reflector no longer conduct current. Consequently, the base of the transistor 21 obtains a higher potential, so that the latter and the transistor 19 become conductive. The current supplied by the constant current source 23 by way of the transistor 22 then flows away across the base-emitter diodes of the two transistors 19 and 21. As the transistor 19 has now become conductive, the charging process of the capacitor is interrupted. The capacitor is discharged by way of the transistor 19 and its voltage rapidly drops.

When the voltage connected to the capacitor 2 then reaches the lower trigger threshold, which is determined by the two resistors 28 and 29 (because the transistor 21 is now conductive and has short-circuited the two resistors 26 and 27), the transistors 19, 21, 22, 24 and 25 again become blocked and the transistor 20 again becomes conductive so that the charging process of the capacitor 2 can again begin. For the external control of the discharge process, a synchronizing pulse S is connected to the transistor 30. This causes the resistor 26 to be short-circuited and the potential across the base of the transistor 22 to drop until the latter becomes conductive.

Figure 3:
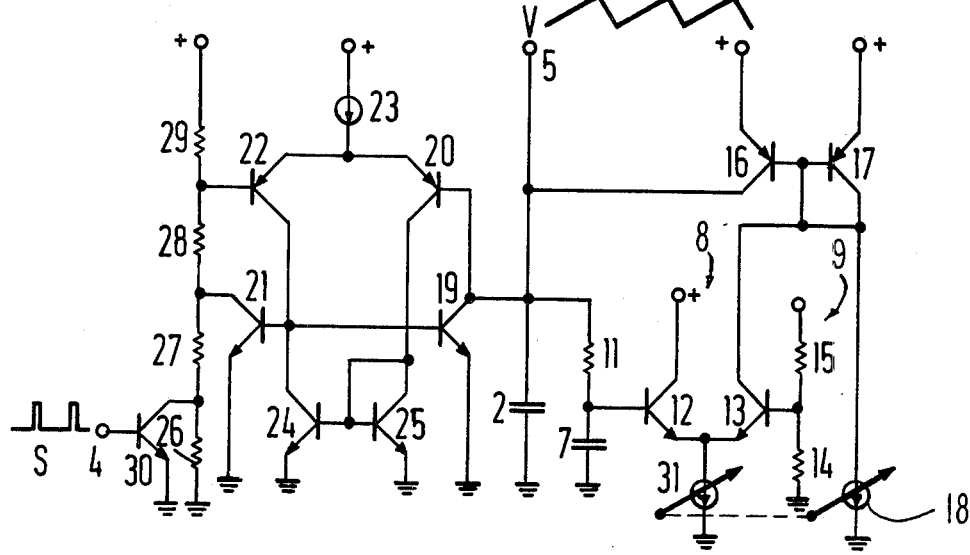
FIG. 3 is a schematic circuit diagram of an exemplary embodiment of the invention illustrating a vertical oscillator of a television receiver.

For use as a vertical oscillator in television receivers, an advantage of the exemplary embodiment of the invention illustrated in FIG. 3 resides in the fact that the mean value of the sawtooth voltage present across the capacitor 7 contains a parabolic component. This offers the possibility of producing a sawtooth signal, distorted in S-shape, as required for correcting the tangential error in television picture tubes. By virtue of the comparison in the comparator and the control of the current reflector, this fluctuation in the mean value results in a non-linear distortion of the charging of the capacitor 2. Because of the symmetry of the parabolic component, the charging of the capacitor 2 takes place more slowly at the beginning of and at the end of a sawtooth period. This gives rise to a S-shaped flattening of the inherently linear charging process. The S-correction is completely symmetrical and is achieved in a simple fashion without complicated RC-networks.

A circuit arrangement constructed in accordance with the invention is not limited to the exemplary embodiment illustrated herein. The principle of the invention can be utilized in any sawtooth generator based on the periodic charging and discharging of a capacitor, in order to maintain the sawtooth amplitude constant.

Although we have described our invention by reference to particular illustrative embodiments, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. An arrangement for regulating the amplitude of a sawtooth wave, comprising:

a first capacitor connected to a current source;

a switch connected to said first capacitor and operated to periodically charge and discharge said first capacitor to form the sawtooth wave, said switch including an input for receiving and being controlled by synchronizing pulses; and a regulating circuit including a second capacitor connected to circuit with said first capacitor and having the mean value of the sawtooth wave, a comparator for comparing the mean value with a reference value, and means connected to said comparator and to said first capacitor for controlling the charging of said first capacitor in dependence upon the comparison to maintain the mean value equal to the reference value, said comparator comprising a differential amplifier and a constant current source connected to said differential amplifier, and comprising a current reflector connected to said differential amplifier and to said first capacitor, said differential amplifier comprising a pair of emitter-coupled transistors, and constant current source connected between said coupled emitters and a reference potential, a first of said transistors including a base connected to said second capacitor and a collector connected to a supply potential, a voltage divider providing the reference value, the second transistor including a collector, and a base connected to the voltage divider to receive the reference potential, and third and fourth base-coupled transistors each having a collector, and an emitter connected to the supply potential, said coupled bases connected to said collectors of said second and third transistors, and said collector of said fourth transistor connected to said first capacitor.

* * * * *